(12) United States Patent
Cornell

(10) Patent No.: US 7,033,184 B2
(45) Date of Patent: Apr. 25, 2006

(54) ELECTRICAL INTERCONNECT DEVICE INCORPORATING ANISOTROPICALLY CONDUCTIVE ELASTOMER AND FLEXIBLE CIRCUIT

(75) Inventor: Christopher Cornell, South Dartmouth, MA (US)

(73) Assignee: Paricon Technologies Corporation, Fall River, MA (US)

( * ) Notice: Subject to any disclaimer, the term of this patent is extended or adjusted under 35 U.S.C. 154(b) by 0 days.

(21) Appl. No.: 10/286,994

(22) Filed: Jun. 13, 2002

(65) Prior Publication Data

US 2003/0096512 A1 May 22, 2003

Related U.S. Application Data

(60) Provisional application No. 60/298,163, filed on Jun. 14, 2001.

(51) Int. Cl.
*H01R 12/00* (2006.01)
*H05K 1/00* (2006.01)

(52) U.S. Cl. ....................................................... 439/67

(58) Field of Classification Search .................. 439/67, 439/66
See application file for complete search history.

(56) References Cited

U.S. PATENT DOCUMENTS

| | | | | |
|---|---|---|---|---|
| 4,737,112 | A | * | 4/1988 | Jin et al. .......................... 439/66 |
| 6,027,346 | A | | 2/2000 | Sinsheimer et al. ............ 439/66 |
| 2002/0055282 | A1 | * | 5/2002 | Eldridge et al. ............... 439/66 |

* cited by examiner

*Primary Examiner*—Javaid H. Nasri
(74) *Attorney, Agent, or Firm*—Jenifer E. Haeckl; Mirick, O'Connell, DeMallie & Lougee, LLP

(57) ABSTRACT

An electrical interconnect circuit device, comprising an anisotropic conductive elastomer (ACE) material defining two opposing faces and a series of conductive columns extending between the faces, at least some of such pads defining an annular receiving surface. Also included is a flexible circuit element defining two opposing faces, one face of the flexible circuit element in electrical contact with one face of the ACE, the flexible circuit element defining a series of conductive pathways extending between its faces. The ACE material and flexible circuit element together provide an interconnect with low inductance.

14 Claims, 2 Drawing Sheets

ELECTRICAL INTERCONNECT DEVICE INCORPORATING ANISOTROPICALLY CONDUCTIVE ELASTOMER AND FLEXIBLE CIRCUIT

CROSS REFERENCE TO RELATED APPLICATION

This application claims priority of Provisional application Ser. No. 60/298,163, filed on Jun. 14, 2001.

FIELD OF THE INVENTION

This invention relates to electrical interconnect devices.

BACKGROUND OF THE INVENTION

Anisotropic Conductive Elastomer (ACE) is a composite of conductive metal elements in an elastomeric matrix that is normally constructed such that it conducts along one axis only. In general, ACE is made to conduct through its thickness. One form of ACE material is made by mixing magnetic particles with a liquid resin, forming the mix into a continuous sheet, and curing the sheet in the presence of a magnetic field. This results in the particles forming a large number of closely spaced columns through the sheet thickness. The columns are electrically conductive. The resulting structure has the unique property of being both flexible and anisotropically conductive. These properties provide for an enabling interconnection medium which, when combined with other technologies, make it possible to realize new interconnect capabilities.

ACE material is married with flexible circuits to provide more dynamic range to an ACE interconnect. The flexible circuit consists of an electrically-insulating material such as polyimide, with opposing conductive pads on the surfaces. The pads are vertically interconnected by plated-through holes. Mounting such a flex circuit to ACE material provides more vertical compliance to the ACE material. This allows the ACE material to be used in assemblies that are not flat, such as circuit boards with solder mask, in which the circuit board pads are lower than the top of the solder mask, thus creating a small well around each pad and into which the ACE material-based interconnect must protrude in order to make electrical contact with the pads.

BGA (ball grid array) devices are electronic components with solder balls placed in a grid and used for final installation (through a solder reflow process) on a printed circuit board. There are other types of electronic packages in which the invention is relevant, including Land Grid Arrays (LGA) that are similar to BGAs, except that the solder is not ball shaped, but rather is formed into a square pad with minimal height. Also, Column Grid Arrays (CGA) have solder pins in place of the ball or pad. Factors such as cost, environment and population density determine which geometry is used.

It is important for the surface of the solder ball, pad or pin that touches the circuit pads be as free of defects as possible. Deformation of the solder ball, especially in the apex area, can result in a poor or a non-functioning electrical connection. The BGA device is typically tested using a custom socket assembly that utilizes spring-loaded contacts. These contacts may have a serrated face that allows tangential contact with individual solder balls.

Although a serrated contact face provides an excellent electrical contact, the overall length of the pin creates a higher electrical inductance for the contact pin assembly as compared to the short path length provided by the ACE material. As microprocessor speeds increase, inductance hampers performance. Some manufacturers have seen this degradation at bandwidths as low as 500 MHz.

SUMMARY OF THE INVENTION

This invention features an electrical interconnect circuit device comprising an anisotropic conductive elastomer (ACE) material defining two opposing faces and a series of conductive columns extending between the faces, and a flexible circuit element defining two opposing faces, one face of the flexible circuit element in electrical contact with one face of the ACE, the other face of the flexible circuit element carrying one or more electrically-conductive pads, at least some of such pads defining an annular receiving surface, the flexible circuit element further defining a series of conductive pathways extending between its faces, wherein the ACE material and flexible circuit element together provide an interconnect with low inductance.

The ACE material may comprise conductive particles embedded in an elastomer, the conductive particles defining the conductive columns. The flexible circuit element conductive pathways may comprise conductor-lined openings extending between the opposing faces of the flexible circuit element. The flexible circuit element may further define conductive pads on both faces of the flexible circuit element and in electrical contact with a conductive pathway, to provide electrical contact areas on the flexible circuit element, one contact area for interfacing with the ACE material, and the other contact area for interfacing with an electrical device.

The conductive pads on one face of the flexible circuit element may be annular, each surrounding a conductive pathway. The electrical device may comprise an electrical package with a series of electrical contact members protruding from a face thereof. The protruding electrical contact members may define an external peripheral shape, and the inside of the annular conductive pads may define the same shape, so that a protruding electrical contact member contacts a conductive pad about the entire periphery of the protruding electrical contact member.

The electrical package may comprise a ball grid array (BGA) with a series of external, partially-spherical contact members, and the inside of the annular conductive pads may define a circle having a diameter smaller than that of the spherical contact member, so that the contact member seats in the pad. The contact member may contact the pad such that the angle defined by coplanar radii from the contact member center to the contact member pad contact locations is approximately 90°.

The electrical package may comprise a land grid array (LGA) with a series of external rectangular contact members, and the conductive pads may be rectangular, to provide effective electrical contact therebetween. The electrical package may comprise a column array (CGA) with a series of external projecting pin contact members. The conductive pads on the face of the flexible circuit element in contact with the ACE may be continuous, in order to maximize contact with the conductive columns in the ACE.

Also featured is an electrical interconnect circuit device comprising an anisotropic conductive elastomer (ACE) material defining two opposing faces and a series of conductive columns extending between the faces, wherein the ACE material comprises conductive particles embedded in an elastomer, the conductive particles defining the conductive columns. Also included in this embodiment is a flexible circuit element defining two opposing faces, one face of the flexible circuit element in electrical contact with one face of the ACE, the flexible circuit element defining a series of conductive pathways extending between its faces, wherein the flexible circuit element conductive pathways comprise conductor-lined openings extending between the opposing faces of the flexible circuit element, and wherein the ACE material and flexible circuit element together provide an interconnect with low inductance.

Also featured is an electrical interconnect circuit device comprising an anisotropic conductive elastomer (ACE) material defining two opposing faces and a series of conductive columns extending between the faces, wherein the ACE material comprises conductive particles embedded in an elastomer, the conductive particles defining the conductive columns. Also included is a flexible circuit element defining two opposing faces, one face of the flexible circuit element in electrical contact with one face of the ACE, the flexible circuit element defining a series of conductive pathways extending between its faces, wherein the flexible circuit element conductive pathways comprise conductor-lined openings extending between the opposing faces of the flexible circuit element, and wherein the flexible circuit element further defines conductive pads on both faces of the flexible circuit element and in electrical contact with a conductive pathway, to provide electrical contact areas on the flexible circuit element, one contact area for interfacing with the ACE material, and the other contact area for interfacing with an electrical device. A plurality of conductive pads on one face of the flexible circuit element are annular, each surrounding a conductive pathway. The ACE material and flexible circuit element together provide an interconnect with low inductance. The electrical device comprises an electrical package with a series of electrical contact members protruding from a face thereof, the protruding electrical contact members defining an external peripheral shape. The inside of the annular conductive pads define the same shape, so that a protruding electrical contact member contacts a conductive pad about the entire periphery of the protruding electrical contact member.

BRIEF DESCRIPTION OF THE DRAWINGS

Other objects, features and advantages will occur to those skilled in the art from the following description of the preferred embodiment, and the accompanying drawings, in which.

DESCRIPTION OF THE PREFERRED EMBODIMENT OF THE INVENTION

The present invention combines ACE material with a unique flexible circuit resulting in an electrical connector circuit device with low inductance. The inventive device also will not substantially damage the apex area of the solder ball element on a BGA, LGA or CGA package.

Figure 1:
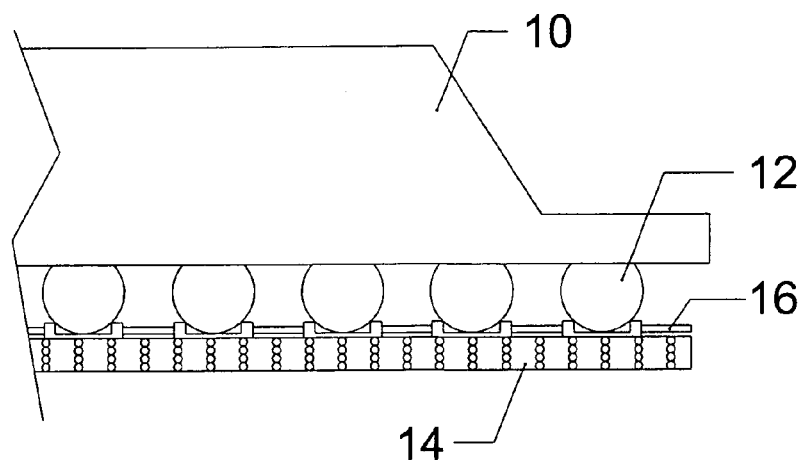
FIG. 1 is a sectional view through the centerline of one of the rows of solder balls of a BGA mounted to the preferred embodiment of the interconnect device of the invention.

FIG. 1 is a sectional view through the centerline of one of the rows of solder balls 12 of a BGA 10 mounted to the preferred embodiment of the invention comprising ACE material 14 electrically coupled to flexible circuit 16. FIG. 1 demonstrates only one embodiment of the invention. The invention comprises a combination of a unique flex circuit with ACE material to create an interconnect device with low inductance that protects the apex of the ball of the BGA, or the end or top of the land or pin for an LGA or CGA, respectively.

Figure 2:
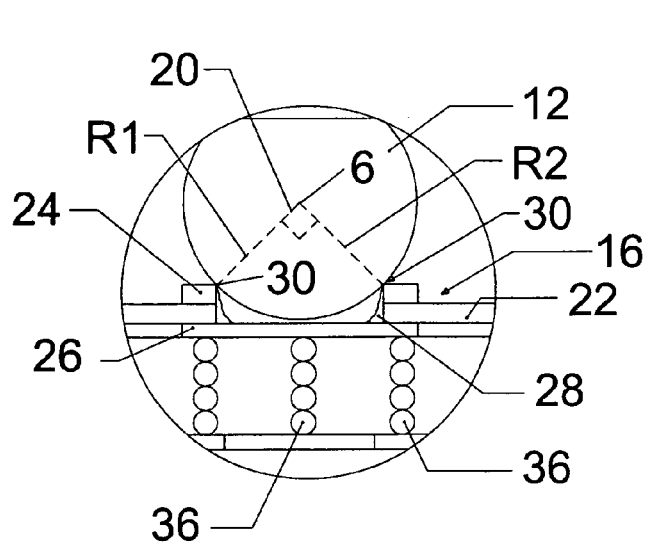
FIG. 2 is a schematic expanded view of a single solder ball interconnected to a board using the interconnect device of FIG. 1.

FIG. 2 is a schematic expanded view of a single solder ball interconnected to a board (not shown) using the device of FIG. 1. Flex circuit 16 houses plated through holes 28 that have a different top and bottom configuration. The top side 24 (the side facing solder ball 12) has a finished hole size that is smaller in diameter than ball 12, so that ball 12 "seats" in hole 28. The finished hole 28 is preferably sized such that the triangle formed between the ball center "C" and the two coplanar radii R1 and R2 that intersect the tangent points 30 to plated through hole 28, form an angle 20 of about 90 degrees. The bottom side of the hole is a continuous, solid pad area 26 providing maximum contact with ACE material 14.

There also may be a monomolecular layer of oxide that typically forms on the outer surface of the ball that can reduce or inhibit the electrical connection between the ball and circuit. The tangent points 30 act as a means for penetrating any oxide layer to increase or enhance the electrical connection between the ball and circuit. Such action is known in the art as wipe. Flex circuit 16 protects ball 12 as well as providing wipe during interconnection. It also serves as a wear member allowing many reuse cycles. It also provides limited compensation for lack of device flatness and tolerance variation on the ball diameter. This compensation is, in general, insufficient for the broad range of BGA devices available. Most of the dynamic range is provided by the ACE material 14, which adds several mils of dynamic range to the interconnect. ACE material 14 includes conductive columns 36, in this instance created from a series of generally aligned conductive particles.

The flex circuit of the invention is preferably made from a base material consisting of a polymer flex circuit with copper laminated on one side. A laser or another means such as a drill is used to create holes through the polymer from the non-copper side. The laser is tuned to penetrate the flex material (typically electrically insulating polyimide material), but not the copper. Conventional plate, print and etch technology is used to form the pads on both sides, and to interconnect the top and bottom sides. The combination of laser drilled and plated holes results in the desired finished hole size and configuration.

Figure 2A:
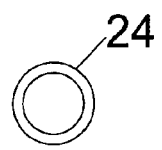
FIG. 2A is a top view of annular conductive pad shown in FIGS. 1 and 2.
Figure 2B:
FIG. 2B is a top view of a top face conductive pad having a rectangular periphery.
Figure 2C:
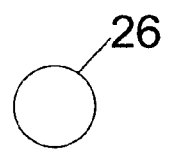
FIG. 2C is a top view of a bottom face conductive pad having a circular shape.
Figure 1A:
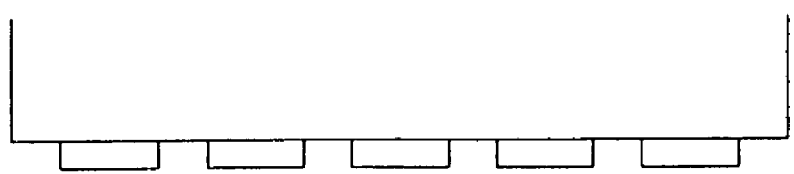
FIG. 1A is a sectional view through the centerline of one of the rows of lands on a land grid array.
Figure 1B:
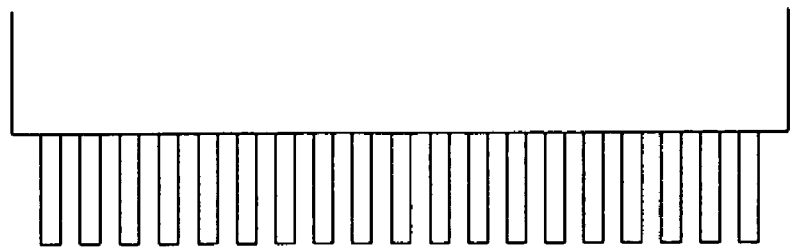
FIG. 1B is a sectional view through the centerline of one of the rows of pins on a column grid array.

The figures reference one of the configurations of the invention. Alternate forms are as follows. Instead of electrically insulating polyimide material as the carrier in the flexible circuit, the invention could utilize a more compliant material such as silicone. This variation would allow the gold plated pads a degree of motion that would assist in the alignment of the solder ball. The pattern that contacts the solder ball has been shown as circular (FIG. 2A). Other shapes are contemplated, such as diamond or square shaped (FIG. 2B) to facilitate different interconnecting geometries, or to provide a smaller contact patch. The use of a laser allows the creation of holes of any shape. What is shown herein is the flex and ACE material as two distinct parts. However, the ACE material could be cast directly on the flexible circuit itself, creating an integral interconnect device.

Other embodiments will occur to those skilled in the art and are within the following claims.

The invention claimed is:

1. An electrical interconnect circuit device, comprising:
   an anisotropic conductive elastomer (ACE) material defining two opposing faces and a series of conductive columns extending between the faces; and
   a flexible circuit element defining two opposing faces, one face of the flexible circuit element in electrical contact with one face of the ACE, the other face of the flexible circuit element carrying one or more electrically-conductive pads, at least some of such pads defining an annular receiving surface, the flexible circuit element further defining a series of conductive pathways extending between its faces;
   wherein the ACE material and flexible circuit element together provide an interconnect with low inductance.

2. The electrical interconnect circuit device of claim 1, wherein the ACE material comprises conductive particles embedded in an elastomer, the conductive particles defining the conductive columns.

3. The electrical interconnect circuit device of claim 1, wherein the flexible circuit element conductive pathways comprise conductor-lined openings extending between the opposing faces of the flexible circuit element.

4. The electrical interconnect circuit device of claim 3, wherein the flexible circuit element further defines conductive pads on both faces of the flexible circuit element and in electrical contact with a conductive pathway, to provide electrical contact areas on the flexible circuit element, one contact area for interfacing with the ACE material, and the other contact area for interfacing with an electrical device.

5. The electrical interconnect circuit device of claim 3, wherein a plurality of conductive pads on one face of the flexible circuit element are annular, each surrounding a conductive pathway.

6. The electrical interconnect circuit device of claim 5, further comprising an electrical package with a series of electrical contact members protruding from a face thereof.

7. The electrical interconnect circuit device of claim 6, wherein the protruding electrical contact members define an external peripheral shape, and wherein the inside of the annular conductive pads define the same shape as the external peripheral shape of said protruding electrical contact members, so that a protruding electrical contact member contacts a conductive pad about the entire periphery of the protruding electrical contact member.

8. The electrical interconnect circuit device of claim 7, wherein the electrical package comprises a ball grid array (BGA) with a series of external, partially-spherical contact members, and wherein the inside of the annular conductive pads define a circle having a diameter smaller than that of the spherical contact member, so that the contact member seats in the pad.

9. An electrical interconnect circuit device, comprising:
   an anisotropic conductive elastomer (ACE) material defining two opposing faces and a series of conductive columns extending between the faces; and
   a flexible circuit element defining two opposing faces, one face of the flexible circuit element in electrical contact with one face of the ACE, the other face of the flexible circuit element carrying one or more electrically-conductive pads, at least some of such pads defining an annular receiving surface, the flexible circuit element further defining a series of conductive pathways extending between its faces;
   wherein the ACE material and flexible circuit element together provide an interconnect with low inductance;
   wherein the contact member contacts the pad such that the angle defined by coplanar radii from the contact member center to the contact member pad contact locations is approximately 90°.

10. The electrical interconnect circuit device of claim 7, wherein the electrical package comprises a land grid array (LGA) with a series of external rectangular contact members, and wherein the conductive pads are rectangular, to provide effective electrical contact therebetween.

11. The electrical interconnect circuit device of claim 7, wherein the electrical package comprises a column array (CGA) with a series of external projecting pin contact members.

12. The electrical interconnect circuit device of claim 5, wherein the conductive pads on the face of the flexible circuit element in contact with the ACE are continuous, in order to maximize contact with the conductive columns in the ACE.

13. An electrical interconnect circuit device, comprising:
   an anisotropic conductive elastomer (ACE) material defining two opposing faces and a series of conductive columns extending between the faces wherein the ACE material comprises conductive particles embedded in an elastomer, the conductive particles defining the conductive columns;
   a flexible circuit element defining two opposing faces, one face of the flexible circuit element in electrical contact with one face of the ACE, the other face of the flexible circuit element carrying one or more electrically-conductive pads, at least some of such pads defining an annular receiving surface, the flexible circuit element defining a series of conductive pathways extending between its faces, wherein the flexible circuit element conductive pathways comprise conductor-lined openings extending between the opposing faces of the flexible circuit element and in electrical contact with the pads; and
   wherein the ACE material and flexible circuit element together provide an interconnect with low inductance.

14. An electrical interconnect circuit device, comprising:
   an anisotropic conductive elastomer (ACE) material defining two opposing faces and a series of conductive columns extending between the faces, wherein the ACE material comprises conductive particles embedded in an elastomer, the conductive particles defining the conductive columns; and
   a flexible circuit element defining two opposing faces, one face of the flexible circuit element in electrical contact with one face of the ACE, the flexible circuit element defining a series of conductive pathways extending between its faces, wherein the flexible circuit element conductive pathways comprise conductor-lined openings extending between the opposing faces of the flexible circuit element, and wherein the flexible circuit element further defines conductive pads on both faces of the flexible circuit element and in electrical contact with a conductive pathway, to provide electrical contact areas on the flexible circuit element, one contact area for interfacing with the ACE material, and the other contact area for interfacing with an electrical device, wherein a plurality of conductive pads on one face of the flexible circuit element are annular, each surrounding a conductive pathway;

wherein the ACE material and flexible circuit element together provide an interconnect with low inductance; and wherein the electrical device comprises an electrical package with a series of electrical contact members protruding from a face thereof, the protruding electrical contact members defining an external peripheral shape, and wherein the inside of the annular conductive pads define the same shape as the external peripheral shape of said protruding electrical contact members, so that a protruding electrical contact member contacts a conductive pad about the entire periphery of the protruding electrical contact member.

* * * * *